United States Patent [19]

Endo

[11] Patent Number: 4,851,964

[45] Date of Patent: Jul. 25, 1989

[54] CONNECTING MECHANISM FOR ELECTRONIC CIRCUIT BOARD BLANKS

[75] Inventor: Kiyoshi Endo, Fujinomiya, Japan

[73] Assignee: Terumo Kabushiki Kaisha, Tokyo, Japan

[21] Appl. No.: 184,364

[22] Filed: Apr. 21, 1988

[30] Foreign Application Priority Data

Apr. 21, 1987 [JP] Japan .............................. 62-60142[U]

[51] Int. Cl.⁴ .............................................. H05K 7/02
[52] U.S. Cl. .................................... 361/397; 206/328; 206/342; 206/345; 361/417; 361/419; 374/208
[58] Field of Search ............... 206/328, 330, 342, 343, 206/345; 361/397, 398, 412, 414, 417, 419–420, 421; 374/141, 208

[56] References Cited

U.S. PATENT DOCUMENTS

| | | | |
|---|---|---|---|
| 3,550,766 | 12/1970 | Nixen et al. .......................... | 206/328 |
| 3,958,075 | 5/1976 | Kautman ............................. | 361/421 |
| 4,297,647 | 10/1981 | Akiyama et al. .................... | 361/421 |
| 4,565,458 | 1/1986 | Iida et al. ............................ | 374/170 |
| 4,579,464 | 1/1986 | Yamazaki et al. .................. | 374/208 |
| 4,600,971 | 7/1986 | Rose et al. ........................... | 361/421 |
| 4,611,262 | 9/1986 | Galloway et al. ................... | 361/421 |

FOREIGN PATENT DOCUMENTS 60-157031  8/1985  Japan .

Primary Examiner—A. D. Pellinen
Assistant Examiner—Gregory D. Thompson
Attorney, Agent, or Firm—Burns, Doane, Swecker & Mathis

[57] ABSTRACT

A succession of electronic circuit board blanks contoured in a board blank strip support electronic parts such as microcomputers and other components thereon and are joined at spaced intervals by narrow joints such as ribs which are spaced considerably apart from the microcomputers which are highly susceptible to stresses. When the board blanks are severed from each other by cutting off the joints, no substantial stresses will be applied to the microcomputers on the board blanks. The board blanks can easily be separated automatically into electronic circuit boards successively.

7 Claims, 2 Drawing Sheets

CONNECTING MECHANISM FOR ELECTRONIC CIRCUIT BOARD BLANKS

BACKGROUND OF THE INVENTION

The present invention relates to a connecting mechanism for electronic circuit board blanks, and more particularly to a connecting mechanism including a succession of electronic circuit board blanks for supporting electronic parts thereon and joined at spaced intervals by narrow joints, which can subsequently be cut off automatically to separate the electronic circuit board blanks from each other without causing damage to the electronic parts so that electronic circuit boards can be produced from a board material with a high yield.

Small electronic circuit boards have been in wide use which make electronic products small in size, allow them to be produced highly efficiently, and permit electronic components mounted thereon to be electronically connected to each other for ensuring accurate operation of the products. For example, slender electronic clinical thermometers incorporate narrow circuit boards on which small electronic parts are mounted.

For mass-producing circuit boards to be assembled in electronic clinical thermometers, a plurality of board blanks each with a printed circuit are contoured in a relatively large insulative strip. After various electronic parts such as one-chip microcomputers, resistors, and the like are mounted on the board blanks, the board blanks are cut off for use as electronic circuit boards. The board blanks on the strip are joined together by joints which have perforations for easy separation.

The board blanks are separated or cut off from the skeleton after the electronic parts have been mounted thereon, as described above. The board blanks as they remain joined to the strip are closely positioned at distance which approximate the diameter of the perforations. Therefore, it is quite difficult to sever the board blanks off the strip with a press or the like. Since the perforations extend entirely around the board blanks, if the board blanks were cut off by an automatic machine, the board blanks and the mounted electronic components would be subjected to stresses applied by the cutting forces, tending to damage the circuits and the electronic components. Accordingly, it is the current practice to separate the board blanks manually along the perforated cutoff lines. The process of separating the board blanks is quite time-consuming, and hence the mass production of such electronic circuit boards is low in efficiency.

SUMMARY OF THE INVENTION

It is a general object of the present invention to provide a connecting mechanism including a succession of electronic circuit board blanks supporting electronic parts thereon and joined at spaced intervals by narrow joints which are spaced considerably apart from those electronic parts mounted on the board blanks which are highly susceptible to stresses, so that, when the board blanks are severed from each other, no substantial stresses will be applied to the electronic components on the board blanks and the board blanks will easily be separated automatically into electronic circuit boards successively.

Another object of the present invention is to provide a connecting mechanism comprising a succession of electronic circuit board blanks for supporting electronic components thereon and joined at spaced intervals by severable joints disposed at such locations as to keep the electronic components substantially free from stresses produced when the joints are severed.

Still another object of the present invention is to provide a connecting mechanism wherein the electronic circuit board blanks comprise circuit board blanks for electronic clinical thermometers, said electronic components being mounted substantially centrally on the circuit board blanks, respectively, said joints being joined to said circuit board blanks in spaced relation to the electronic components.

Yet another object of the present invention is to provide a connecting mechanism wherein each of the circuit board blanks comprises a component support and a temperature transmitting member, the component support being of a relatively wide rectangular shape while the temperature transmitting member being of a relatively narrow slender shape extending therefrom.

Yet still another object of the present invention is to provide a connecting mechanism wherein one of the circuit board blanks and another adjacent one of the circuit board blanks are arranged symmetrically, the one circuit board blank having a shoulder joined to the temperature transmitting member of the other circuit board blank by one of the joints.

A further object of the present invention is to provide a connecting mechanism wherein the electronic component on each of the circuit board blanks is positioned substantially centrally on the rectangular shape in spaced relation to the temperature transmitting member and the shoulder.

A still further object of the present invention is to provide a connecting mechanism wherein the one of the joints by which the shoulder of the one circuit board blank and the temperature transmitting member of the other circuit board blank are joined to each other comprises a rib.

Yet still further object of the present invention is to provide a connecting mechanism wherein the rib is of a sufficient length to be cut off by a press.

The above and other objects, features and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

An electronic circuit board produced from a board blank strip including connecting mechanism according to the present invention will first be described with reference to an electronic clinical thermometer. The electronic clinical thermometer is typically described specifically in Japanese Laid-Open Patent Publication No. 60-157031.

Figure 1:
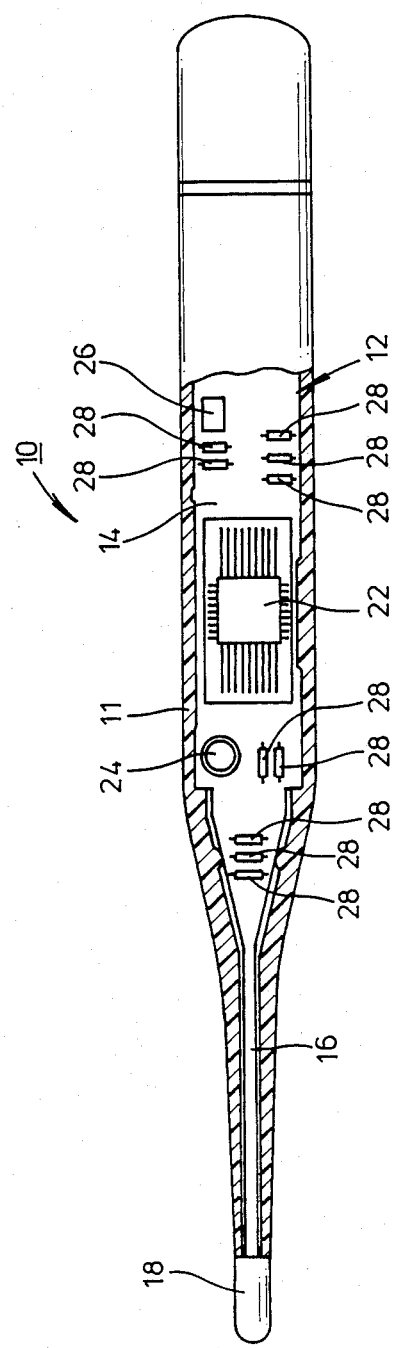
FIG. 1 is a view, partly cut away, of an electronic clinical thermometer incorporating an electronic circuit board produced from a board blank strip including a connecting mechanism according to the present invention.

FIG. 1 shows an electronic clinical thermometer generally designated by the reference numeral 10. The electronic clinical thermometer 10 has a slender casing 11 substantially in the shape of a pentagon as viewed in plan. The casing 11 houses therein an electronic circuit board 12 produced from a board blank strip including a connecting mechanism for electronic circuit board blanks according to the present invention.

The circuit board 12 comprises a relatively wide component support 14 of a rectangular shape and a temperature transmitting member 16 extending integrally therefrom with a slender shape. The temperature transmitting member 16 is connected to a temperature detector 18, preferably a thermometer, which is mounted on the narrow distal end of the electronic clinical thermometer 10.

The component support 14 supports thereon various electronic circuit components which virtually make up the electronic clinical thermometer 10. Substantially on a central area of the component support 14, there is mounted a microcomputer 22 located in a position which is substantially free from stresses that are exerted when the circuit board 12 is cut off from a board blank strip and adjacent board blanks. The microcomputer 22 effects a predetermined arithmetic operation on an electronic signal, representative of body temperature information, which is detected by the temperature detector 18 and transmitted through the temperature transmitting member 16 to the microcomputer 22. The microcomputer 22 also displays the obtained body temperature information on a liquid crystal display unit or the like (not shown).

A pressure rising coil 24 is mounted on the component support 14 at a position slightly spaced from the microcomputer 22 toward the temperature transmitting member 16. The coil 24 is part of a buzzer for producing an audible signal which indicates to the user that desired temperature measuring process is completed. A quartz crystal oscillator 26 is mounted on the component support 14 near one end thereof remote from the temperature transmitting member 16. The quartz crystal oscillator 26 generates a clock signal supplied to the microcomputer 22 for enabling the latter to perform various control functions. Various other electronic parts 28 such as resistors, capacitors, and the like are also mounted on the component support 14 at various locations.

Figure 2:
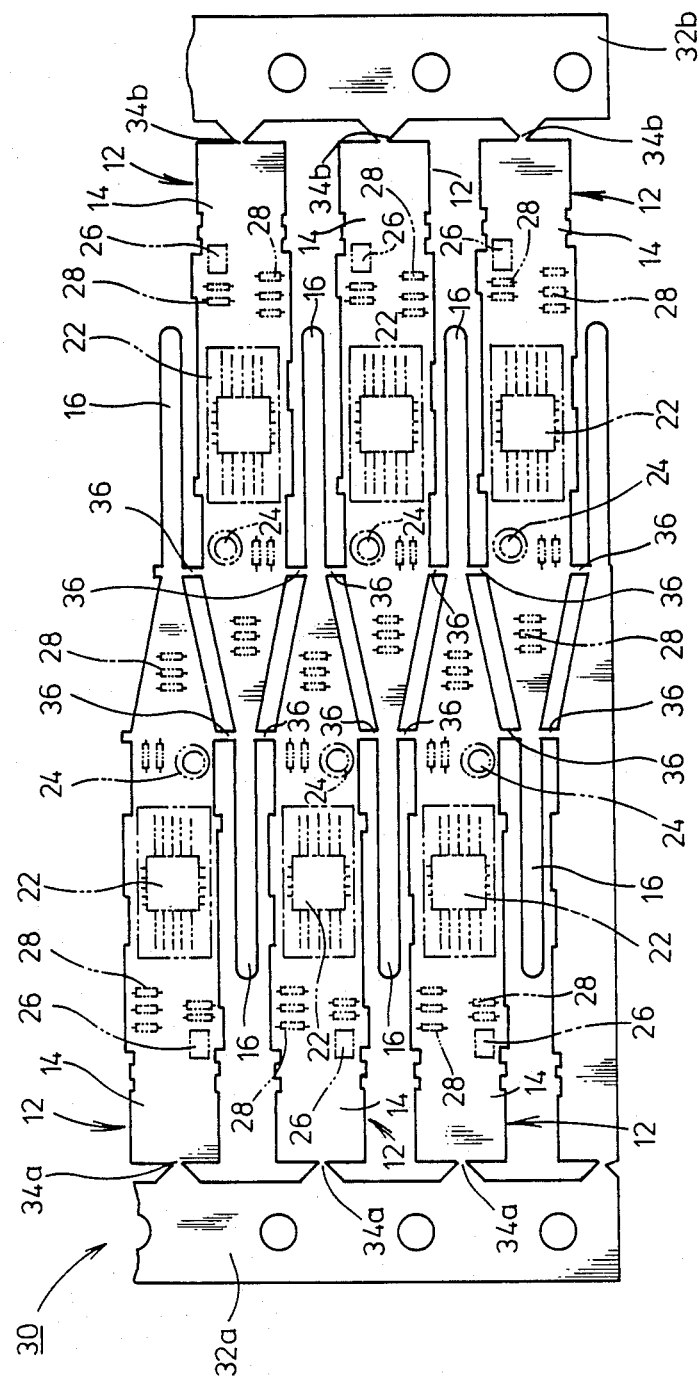
FIG. 2 is a fragmentary plan view of a succession of electronic circuit board blanks joined by a connecting mechanism of the present invention.

For producing the circuit board blank 12 which is constructed as above and on which the electronic parts are mounted, a plate-like board blank strip 30 as shown in FIG. 2 is machined to provide a succession of interconnected board blanks 12. The blank strip 30 is cut out to manufacture many circuit boards in a short period of time with a good yield. The board blanks 12 are arranged side by side in two rows in a staggered configuration so that each of their distal or narrower ends in one of the blank rows is inserted between adjacent two of the board blanks 12 in the other opposite row. The board blanks 12 have tail or wider ends joined to opposite side webs 32a, 32b of the blank strip 30 through narrow joints or junctions 34a, 34b, respectively. The board blanks 12 are spaced by gaps therebetween and interconnected by narrow joints or ribs 36 at selected positions where stresses will not substantially be applied when they are separated. More specifically, the positions of the ribs 36 are selected such that any stresses which will be exerted when the ribs 36 are cut off will not be large enough to impair electric or electronic operation or characteristics of the mounted electronic components, printed circuit patterns, soldered connections, and other circuit elements. Two adjacent board blanks 12 are arranged symmetrically and joined to each other by two ribs 36 each connected to the proximal end of the temperature transmitting member 16 of one of the board blanks 12 and to the shoulder of the component support 14 of the other board blanks 12. It can be seen from FIG. 2 that the junctions 34a, 34b and the ribs 36 are spaced certain distances from the microcomputers 22 which can easily be damaged by stresses applied upon separation of the board blanks 12. On each of the board blanks 12, the microcomputer 22 is positioned substantially centrally on the rectangular shape of the component support 14 in spaced relation to the shoulders thereof and the temperature transmitting member 16. The ribs 36 are of a sufficient length to be cut off by a press or another automatic cutting machine.

The quartz crystal oscillators 26 are located comparatively close to the junctions 34a, 34b. However, since the quartz crystal oscillators 26 are relatively rigid and resistant to stresses caused upon separation of the board blanks 12, the quartz crystal oscillators 26 are protected against damage. The side edges of each of the component supports 14 of the board blanks 12 do not have any ribs or joints to be cut off subsequently because burrs that might be left after separation of such ribs would make it impossible to assemble the board blank 12 into the casing 11 of the electronic clinical thermometer 10.

The connecting mechanism for electronic circuit boards according to the present invention is basically constructed as described above. Operation and advantages of the connecting mechanism will now be described below.

As shown in FIG. 2, a succession of board blanks 12 are first contoured as integrally joined members in a board blank strip 30. In the board blank strip 30, each of the board blanks 12 is connected at its tail end to one of the side webs 32a, 32b through the junction 34a or 34b. Adjacent ones of the board blanks 12 are also integrally joined to each other by the ribs 36. Then, the contoured board blank strip 30 is fed to a parts assembling process in which the microcomputers 22, the coils 24, the quartz crystal oscillators 26, the electronic parts 28 such like resistors, and other electronic components are successively mounted on the board blanks 12.

Thereafter, the board blanks 12 are severed from the side webs 32a, 32b and from each other. At this time, inasmuch as each board blank 12 is joined to the side web 32a or 32b and to adjacent board blanks 12 only by the junction 34a or 34b and the ribs 36, the board blanks 12 can easily be separated from the strip 30 or skeleton and from each other simply by cutting off the junctions 34a, 34b and the ribs 36. The junctions 34a, 34b and the ribs 36 are positioned considerably apart from the microcomputers 22 which can easily be damaged by stresses applied thereto. Therefore, no substantial stresses are imposed on the microcomputers 22 when the junctions 34a, 34b and the ribs 36 are cut off, and the microcomputers 22 are prevented from stress-induced damage. As can be seen from FIG. 2, certain gaps are defined by the ribs 36 between adjacent ones of the board blanks 12 as they are joined to each other. As a result, the board blanks 12 can be separated highly easily by an automatic machine such as an automatic press.

With the present invention, as described above, the board blanks are integrally joined to the board blank strip and to each other by the narrow joints such as the junctions and ribs in order to mass-produce a plurality of circuit boards on which the electronic components are mounted. The joints are considerably spaced apart from the locations where the electronic components that can easily be damaged by stresses applied upon cutting off the joints are mounted. Accordingly, the board blanks can be separated from the skeleton and from each other without damaging the electronic components mounted thereon. Consequently, accurate and reliable operation of the completed electronic circuit boards is ensured. The board blanks can easily be severed from each other automatically simply by cutting off the joining ribs. As a result, the rate or efficiency of production of the electronic circuit boards can be increased.

Although a certain preferred embodiment has been shown and described, it should be understood that many changes and modifications may be made therein without departing from the scope of the appended claims.

What is claimed is:

1. An assembly comprising;
    a succession of electronic circuit board blanks supporting components thereon;
    a plurality of first joints disposed at spaced intervals connecting adjacent blanks;
    a first side web and a second side web; and
    a plurality of second joints connecting alternating blanks to one of said first and second webs, respectively;
    said electronic board blanks, said first and second side webs, said plurality of first joints, insulative board blank strip,
    said plurality of first and second joints being disposed at such locations as to keep the electronic components substantially free from stresses produced when the first and second joints are severed.

2. An assembly according to claim 1, wherein said electronic circuit board blanks comprise circuit board blanks for electronic clinical thermometers, said electronic components being mounted substantially centrally on said circuit board blanks, respectively, said first and second joints being joined to said circuit board blanks in spaced relation to said electronic components.

3. An assembly according to claim 2, wherein each of said circuit board blanks comprises a component support area and a temperature transmitting member, said component support area being of a relatively wide rectangular shape, while said temperature transmitting member being of a relatively narrow slender shape extending therefrom.

4. An assembly according to claim 3, wherein one of said circuit board blanks and an adjacent one of said circuit board blanks are arranged symmetrically, said one circuit board blank having a shoulder joined to the temperature transmitting member of said adjacent circuit board blank by one of said first joints.

5. An assembly according to claim 4, wherein at least one of said electronic components on each of said circuit board blanks is positioned substantially centrally on the rectangular shape in spaced relation to the temperature transmitting member and said shoulder.

6. An assembly according to claim 4, wherein said one of first joints by which said shoulder of said one circuit board blank and said temperature transmitting member of said adjacent circuit board blank are joined to each other comprises a rib.

7. An assembly according to claim 6, wherein said rib is of a sufficient length to be cut off by a press.

* * * * *